United States Patent
Leary et al.

(10) Patent No.: US 11,008,643 B2
(45) Date of Patent: May 18, 2021

(54) TUNABLE ANISOTROPY OF CO-BASED NANOCOMPOSITES FOR MAGNETIC FIELD SENSING AND INDUCTOR APPLICATIONS

(71) Applicant: Carnegie Mellon University, Pittsburgh, PA (US)

(72) Inventors: Alex M. Leary, Pittsburgh, PA (US); Paul R. Ohodnicki, Pittsburgh, PA (US); Michael E. McHenry, Pittsburgh, PA (US); Vladimir Keylin, Pittsburgh, PA (US); Kevin Byerly, Pittsburgh, PA (US)

(73) Assignee: Carnegie Mellon University, Pittsburgh, PA (US)

(*) Notice: Subject to any disclaimer, the term of this patent is extended or adjusted under 35 U.S.C. 154(b) by 479 days.

(21) Appl. No.: 15/205,217

(22) Filed: Jul. 8, 2016

(65) Prior Publication Data
US 2016/0319412 A1  Nov. 3, 2016

Related U.S. Application Data

(63) Continuation-in-part of application No. 14/278,836, filed on May 15, 2014, now Pat. No. 10,168,392.
(Continued)

(51) Int. Cl.
*C22F 1/10* (2006.01)
*C22C 19/07* (2006.01)
(Continued)

(52) U.S. Cl.
CPC .............. *C22F 1/10* (2013.01); *B82Y 30/00* (2013.01); *B82Y 40/00* (2013.01); *C22C 19/07* (2013.01);
(Continued)

(58) Field of Classification Search
CPC ......... B82Y 30/00; B82Y 40/00; C22C 19/07; C22F 1/10; H01F 1/15333; H01F 41/0226
See application file for complete search history.

(56) References Cited

U.S. PATENT DOCUMENTS

| 4,881,989 A | 11/1989 | Yoshizawa et al. |
| 5,935,347 A | 8/1999 | Suzuki et al. |

(Continued)

FOREIGN PATENT DOCUMENTS

WO    WO2013156397    * 10/2013

OTHER PUBLICATIONS

Legg, V. E. "Survey of square-loop magnetic materials." Dec. 1957. IRE transactions on component parts. p. 106-109. (Year: 1957).*
(Continued)

*Primary Examiner* — Nicholas A Wang
(74) *Attorney, Agent, or Firm* — Fish & Richardson P.C.

(57) ABSTRACT

A method includes producing an amorphous precursor to a nanocomposite, performing devitrification of the amorphous precursor, forming, based on the devitrification, the nanocomposite comprising an induced magnetic anisotropy, and for a first portion of the nanocomposite, determining a desired value of a magnetic permeability of the first portion, tuning, based on the desired value, the induced magnetic anisotropy for the first portion, and adjusting, based on the tuning of the induced magnetic anisotropy of the first portion, a first magnetic permeability value of the first portion of the nanocomposite, wherein the first magnetic permeability value is different from a second magnetic permeability value for a second portion of the nanocomposite.

22 Claims, 15 Drawing Sheets

Related U.S. Application Data

(60) Provisional application No. 62/231,536, filed on Jul. 9, 2015, provisional application No. 61/855,439, filed on May 15, 2013.

(51) Int. Cl.
| | |
|---|---|
| *B82Y 30/00* | (2011.01) |
| *B82Y 40/00* | (2011.01) |
| *H01F 1/153* | (2006.01) |
| *G01R 33/12* | (2006.01) |
| *H01F 41/02* | (2006.01) |
| *G01R 33/00* | (2006.01) |

(52) U.S. Cl.
CPC ..... *G01R 33/1223* (2013.01); *H01F 1/15333* (2013.01); *H01F 41/0226* (2013.01); *G01R 33/0052* (2013.01)

(56) References Cited

U.S. PATENT DOCUMENTS

| | | | |
|---|---|---|---|
| 5,994,899 | A | 11/1999 | Mohri |
| 6,425,960 | B1 | 7/2002 | Yoshizawa et al. |
| 6,727,692 | B2 | 4/2004 | Ciureanu et al. |
| 6,747,449 | B1 | 6/2004 | Maylin et al. |
| 2001/0043134 | A1 | 11/2001 | Decristofaro et al. |
| 2002/0189718 | A1* | 12/2002 | Yoshizawa ............... C22C 45/04 148/313 |
| 2004/0103725 | A1 | 6/2004 | Tomka et al. |
| 2008/0196795 | A1* | 8/2008 | Waeckerle .......... H01F 41/0226 148/540 |
| 2010/0265028 | A1 | 10/2010 | McHenry et al. |
| 2013/0139929 | A1* | 6/2013 | Francoeur ............ C21D 8/1272 148/111 |
| 2014/0152416 | A1* | 6/2014 | Herzer ................ H01F 1/15333 336/233 |
| 2014/0338793 | A1 | 11/2014 | Leary et al. |
| 2015/0007124 | A1 | 1/2015 | Krasnicki et al. |
| 2015/0070124 | A1* | 3/2015 | Kapoor ..................... H01F 3/10 336/211 |

OTHER PUBLICATIONS

Ohnuma et al., "Origin of the magnetic anisotropy induced by stress annealing in Fe-based nanocrystalline alloy," Appl. Phys. Lett., vol. 86, No. 152513, pp. 1-4, 2005.

Ershov et al., "Relaxation of the state with induced transverse magnetic anisotropy in the soft magnetic nanocrystalline alloy Fe73.5Si13.5Nb3B9Cu1," Physics of the Solid State, vol. 54(9):1817-1826, (2012).

Ershov et al., "Effect of thermomagnetic and thermomechanical treatments on the magnetic properties and structure of the nanocrystalline soft magnetic alloy Fe81Si6Nb3B9Cu1," Physics of the Solid State, vol. 55(3):508-519 (2013).

D.I. Gordon and R.E. Brown, "Recent Advances in Fluxgate Magnetometry," IEEE Transactions on Magnetics, vol. MAG-8(1):76-82 (1972).

Mohri et al., "Magneto-Impedance Element," IEEE Transactions on Magnetics, vol. 31(4):2455-2460 (1995).

Ripka et al., "Nanociystalline Fluxgate Cores with Transverse Anisotropy," Sensors, Proceedings of the IEEE, pp. 1570-1572 (2004).

Peng, H.X. et al., Co-based magnetic microwire and field-tunable multifunctional macro-composites (2009) Journal of Non-Crystalline Solids 355:1380-1386.

P. Ohodnicki et al., "Transmission electron microscopy study of large field induced anisotropy (Co 1aLSxFex)89Zr7B4 nanocomposite ribbons with dilute Fe-contents," Journal of Magnetism and Magnetic Materials, 322(3):315-321 (2010).

S.J. Kernion et al., "In-situ investigation of phase formation in nanocrystalline (Co97.5Fe2.5)89Zr7B4 alloy by high temperature x-ray diffraction," Journal of Applied Physics 111, 07A316 (2012).

S. Ishio et al., "Magnetostriction constants of fee Co—Fe—Ni alloys," Journal of Magnetism and Magnetic Materials, 64(96):208-210 (1996).

A. Chaturvedi et al. "Giant magnetoimpedance and field sensitivity in amorphous and nanocrystalline (Co1aLSxFex)89Zr7B4 (xaAL= aAL0, 0.025, 0.05, 0.1) ribbons," Journal of Applied Physics, 109(7):07B508 (2011).

N. Laurita et al. "Enhanced giant magnetoimpedance effect and field sensitivity in co-coated soft ferromagnetic amorphous ribbons," Journal of Applied Physics 109(7):07C706 (2011).

* cited by examiner

190

210

220

TUNABLE ANISOTROPY OF CO-BASED NANOCOMPOSITES FOR MAGNETIC FIELD SENSING AND INDUCTOR APPLICATIONS

CLAIM OF PRIORITY

This application is a continuation-in-part and claims the benefit of priority under 35 U.S.C. § 120 to U.S. patent application Ser. No. 14/278,836, filed on May 15, 2014, which claims priority to provisional U.S. Patent Application No. 61/855,439, filed on May 15, 2013. This application also claims priority under 35 U.S.C. § 119(e) to provisional U.S. Patent Application No. 62/231,536, filed on Jul. 9, 2015, the entire contents of each of which are hereby incorporated by reference.

GOVERNMENT SUPPORT CLAUSE

This invention was made with government support under DE-AR0000219 awarded by the Department of Energy. The government has certain rights in the invention.

FIELD OF USE

The present disclosure relates to a class of soft magnetic materials with tunable magnetic permeability, low core losses at high frequencies and methods of manufacturing the same. These materials and their magnetic properties are stable to high temperatures with relevant applications that include transformer and inductor cores and sensing elements in magnetic field sensors. Specifically the present disclosure pertains to compositions for and methods to impart highly tunable and robust/stable anisotropy in nanocomposite ribbons with Co-rich compositions.

BACKGROUND

Nanocomposite soft magnetic materials comprise crystalline grains smaller than 100 nm embedded within an amorphous matrix. Extensive research into this class of materials resulted in their use in a wide range of soft magnetic applications. The extended set of processing dimensions in nanocomposites, such as grain size, phase identity, crystal orientation and volume fraction, present opportunities to tailor properties. Several classes of nanocomposite alloys exist, e.g., as described in U.S. Pat. No. 4,881,989, 5,935, 347, and U.S. Patent Publication No. 2010/0265028. Compositions typically consist of compositions (TL-TE-M) involving combinations of late transition metals (TL), early transition metals (TE), and metalloids (M). Compositions (such as those described in U.S. Pat. No. 5,935,347) also require small additions of noble metals such as Cu to promote finer grain structures. The Curie temperature of the amorphous phase in iron (Fe) rich nanocomposite alloys is typically below 400° C. and soft magnetic properties degrade approaching and above this temperature. Cobalt additions can increase the amorphous phase Curie temperature, as described in U.S. Patent Publication No. 2010/0265028, and extend useful range of operating temperatures.

The introduction of a uniaxial magnetic anisotropy in nanocomposite soft magnetic materials is a well-known technique to control permeability. Magnetic permeability ($\mu$) is the change in induction (B) with an applied field (H) and is equal to the slope of a magnetization curve. Both high and low permeabilities may be advantageous depending on the application and it is often desirable to tune permeability to a specific value. In particular, flat loop magnetization with linear response of the magnetization with applied field, to a field designated as the anisotropy field, $H_K$, where the magnetization reaches it saturation value, $M_s$, are desirable for many applications. In flat loop materials the permeability at a fixed temperature remains approximately single valued up to the saturating field, $H_K$, and given by:

$$\mu = M_s \backslash H_K$$

For low permeability materials in toroidal cores that show linear magnetization responses, the anisotropy energy density $K_u$ is:

$$K_u = \frac{M_s H_k}{2} = \frac{B_s^2}{2\mu}.$$

Here, $B_s$ is the saturation induction and the permeability $\mu$ is inversely proportional to the energy density for wound cores with transverse induced anisotropy.

The manufacturing process to make nanocomposites of this type typically include an annealing step where one or more crystalline phases is nucleated and grown within an amorphous precursor material. Several processing methods are available during annealing to develop magnetic anisotropies including the introduction of a magnetic and/or stress field. The use of an amorphous precursor limits the geometry of nanocomposite soft magnets to a critical cooling dimension and these materials often take the shape of cast ribbons resulting from a melt spinning technique or wires drawn from a melt. These ribbons may be tape wound or stamped and stacked (as described in U.S. Patent Publication No. 2001/0043134) into cores for use. Stresses in the final component include residual stresses formed during the casting process, those induced during the annealing, as well as any further processing step such as winding, impregnating, and cutting. Successful devices require adequate control over all processing steps to include or reduce stresses where desired for a specific application.

The induced magnetic anisotropy and demagnetization field, $H_d$, created by the core shape influences the domain pattern in the core. Free magnetic poles on the surface create the demagnetization field, which tend to bend field lines in the material. Toroidal shapes minimize demagnetization effects for materials with domains oriented along the circumference.

Referring to FIG. 1, diagram 100 shows two domain orientations in a tape wound core, e.g., domain patterns in strain annealed tape-wound cores with transverse (left) patterns 102 and longitudinal (right) domain patterns 104. The direction of the induced anisotropy and the demagnetization field of the core shape determine the primary domain orientation. Annealing materials with negative and positive magnetostriction ($\lambda$) in the crystalline phase under tension can result in transverse and longitudinal domain patterns respectively depending on annealing conditions. Dynamic magnetization processes are complicated but transverse domains in wound core material tend to change magnetization by rotation whereas longitudinal domains change magnetization by domain wall motion. The sign of the magnetostriction in the crystalline phase of Fe—Si nanocomposites controls the direction of the induced easy axis within a plane oriented based on the primary stress direction.

The direction of the magnetic easy axis determines permeability of the core. Referring to FIG. 2, diagram 110 shows the resulting magnetization vs. field curves for soft magnetic cores with different induced magnetic anisotropies. In particular, diagram 110 shows magnetization vs. field curves of A) annealed core without an applied field/stress, B) longitudinally field annealed or strain annealed core resulting in primarily longitudinal domains, and C) transverse field annealed or strain annealed core resulting in primarily transverse domains. Curve A results after annealing without an external magnetic/stress field and is the result of the well know random exchange phenomenon. The high permeability shown in Curve B can result from annealing in a longitudinal magnetic field or by strain annealing ribbon with positive magnetostriction in the crystalline phase under tension. The longitudinal magnetic field is applied in the same direction as the excitation field created by the windings on a toroidal core (circumferential). The low permeability shown in Curve C can result from annealing cores in a transverse magnetic field (perpendicular to the excitation field) and/or strain annealing ribbon with negative magnetostriction in the crystalline phase.

Properties in nanocomposites may differ from as-cast or mostly amorphous materials of similar compositions. Magnetostriction is primarily determined by composition and structure of the material, temperature, and stress. The crystalline phase composition often differs from the residual amorphous phase composition and apparent magnetostriction values are composed of contributions from each phase. Crystalline phases also offer additional processing variables such as ordering of atoms/defects, preferred orientations, and the volume fraction of crystals that are useful in the development of anisotropies. In strain annealed Fe-rich nanocomposite cores, the resulting permeability shows an inverse relationship to the magnitude of the stress field applied during annealing. Determination of the underlying mechanism behind the permeability change in magnetic field annealing has proven elusive, but evidence of residual lattice strain in strain annealed materials has been shown. (See, e.g., Ohnuma et al., "Origin of the magnetic anisotropy induced by stress annealing in Fe-based nanocrystalline alloy," Appl. Phys. Lett., vol. 86, no. 152513, pp. 1-4, 2005). This has been duplicated and the effect of strain annealing materials with positive and negative crystal phase magnetostrictions in the FeSi composition range has been demonstrated. (See, e.g., Ershov et al., "Relaxation of the state with induced transverse magnetic anisotropy in the soft magnetic nanocrystalline alloy Fe73.5Si13.5Nb3B9Cu1," Physics of the Solid State, vol. 54, no. 9, pp. 1817-1826, September 2012. http://www.springerlink.com/index/10.1134/S1063783412090119; and Ershov et al., "Effect of thermomagnetic and thermomechanical treatments on the magnetic properties and structure of the nanocrystalline soft magnetic alloy Fe81Si6Nb3B9Cu1," Physics of the Solid State, vol. 55, no. 3, pp. 508-519, March 2013. http://link.springer-.com/10.1134/S1063783413030098). This work also showed that while the anisotropy induced by magnetic field annealing is largely erasable at temperatures above ~250° C., strain induced anisotropies were stable to much higher temperatures. However, the low Curie temperature of the amorphous phase in Fe-rich alloys prevents the exploitation of the thermal stability of the induced anisotropy for elevated temperature applications. Additionally, the brittle nature of crystallized Fe-rich compositions limits the accessible range of induced anisotropies and make core winding difficult.

Nanocomposite ribbons can be subsequently crushed into flake and then consolidated by compaction techniques. The uniaxial anisotropy can be exploited to align the flakes in an applied field prior to compaction. This alloys for retaining anisotropy in shapes possible through consolidation.

Fluxgate and giant magnetoimpedance (GMI) magnetic field sensors require soft magnetic sensing elements. The sensing element in a fluxgate magnetometer is typically a soft magnetic core that is alternately driven to saturation by a drive coil. (See D. I. Gordon and R. E. Brown, "Recent Advances in Fluxgate Magnetometry," IEEE Transactions on Magnetics, vol. MAG-8, no. 1, pp. 76-82, 1972). When placed in an external field, the core saturates asymmetrically producing even harmonics proportional to the field strength according to Faraday's law. GMI sensors measure changes in the impedance ($Z=R+j\omega L$) of a soft magnetic sensing element where R is the dc resistance and L is the inductance. (See Mohri et al., "Magneto-Impedance Element," IEEE Transactions on Magnetics, vol. 31, no. 4, pp. 2455-2460, 1995). The skin depth of the sensing element is sensitive to permeability and resistivity. In GMI sensors, the primary mechanism that determines field sensitivity $\Delta z(H)/z(H)$ involves control of permeability in the sensing element. The defining measure of sensor performance is the signal to noise ratio. Random jumps in magnetization in the sensing element (Barkhausen noise) degrade performance and should be minimized through the use of a low loss sensing element. Amorphous materials have been used with success in fluxgate cores and GMI sensors, but show thermal instabilities at high temperature and are not applicable for high temperature applications such as deep drilling operations or current sensing in high temperature electronics.

Deep well drilling requires robust sensor packages that can operate in a harsh environment of corrosive fluids and temperatures and pressures in excess of 200° C. and 20 ksi. The sensor package relays parameters such as torque, temperature, and bit azimuth to an operator in real time to ensure drilling accuracy. The magnetometer in the sensor package can be used to provide azimuth information with respect to the earth's field or to home in on a separate magnetic source, as required for relief well intersections. However, the crystallization temperature of amorphous materials limits their structural stability and prevents their use in high temperature applications.

Controlling the permeability of the sensing element can be used to reduce the noise in fluxgates (See Ripka et al., "Nanocrystalline Fluxgate Cores with Transverse Anisotropy," in Sensors, Proceedings of the IEEE, 2004, pp. 1570-1572) and to tune the field response of a GMI sensor, as described in U.S. Pat. No. 5,994,899, 6,747,449, US Publication No. 2004/0403725, and U.S. Pat. No. 6,727,692. Transverse anisotropy is preferable in ring or racetrack fluxgate cores and the preferred anisotropy direction in GMI sensing elements is shown in diagram 120 of FIG. 3. Fe-based nanocomposites are limited due to relatively low Curie temperatures in the amorphous phase and a limited response to stress annealing. Additionally, for materials that require robust mechanical properties, the brittle nature of Fe-based materials after crystallization limits their use. The composition of Co-rich nanocomposites can be varied to achieve brittle or ductile ribbons after crystallization, depending on the application requirement. What is needed is a soft magnetic material that is stable at high temperatures with a strong response to stress annealing. This induced anisotropy and resulting anisotropy field, in this material should also be tunable for a range of applications up a high value. Preferably, the material should exhibit adequate mechanical properties such as ductility after thermo-mechanical processing to allow for successful fabrication of robust devices.

SUMMARY

This document describes a method including producing an amorphous precursor to a nanocomposite; performing devitrification of the amorphous precursor; forming, based on the devitrification, the nanocomposite comprising an induced magnetic anisotropy; and for a first portion of the nanocomposite, determining a desired value of a magnetic permeability of the first portion; tuning, based on the desired value, the induced magnetic anisotropy for the first portion, and adjusting, based on the tuning of the induced magnetic anisotropy of the first portion, a first magnetic permeability value of the first portion of the nanocomposite, wherein the first magnetic permeability value is different from a second magnetic permeability value for a second portion of the nanocomposite.

In some examples, the actions include annealing the first portion of the nanocomposite, the annealing including heating the first portion of the nanocomposite to a predetermined temperature; modifying the first portion of the nanocomposite to a predetermined geometric configuration, the modifying including applying a magnitude of stress to the first portion; and adjusting the predetermined temperature, the predetermined geometric configuration, or the magnitude of stress applied to the first portion based on the desired value of the magnetic permeability. In some examples, the actions can include based on the annealing, controlling a nanocrystallization process for the nanocomposite in one or more geometries. In some examples the actions include tuning the induced magnetic anisotropy of the first portion by varying one or more of a temperature of one or more heated thermal blocks configured to contact the first portion of the nanocomposite during the tuning and an exposure time of the first portion to the one or more heated thermal blocks. In some examples, the nanocomposite includes a tape wound core. Based on the tuning, the actions can include producing one or more of (i) a square loop core, and (ii) a balanced flux distribution in the nanocomposite during a single winding of the tape-wound core. The exposure time of the first portion to the one or more heated thermal blocks is varied by adjusting a length of the one or more heated thermal blocks or a speed of the first portion moving between at least two of the one or more heated thermal blocks. The actions include tuning the magnetic anisotropy of the first portion by varying one or more of a direction of a stress applied to the first portion and a direction of a magnetic field applied to the first portion. The actions include adjusting the first magnetic permeability value to be less than the second magnetic permeability value when the first portion comprises one or more of a bend in the nanocomposite, a pole face of the nanocomposite, and a radius of the nanocomposite. The adjusting of the first magnetic permeability value reduces a flux concentration in the nanocomposite relative to a flux concentration in the nanocomposite independent of adjusting, reduces a stray field magnitude in the nanocomposite with the adjusted magnetic anisotropy relative to a stray field magnitude in the nanocomposite independent of adjusting, or reduces an imbalance of a flux distribution in the nanocomposite between the first portion and the second portion relative to a flux distribution imbalance in the nanocomposite independent of adjusting. The actions include forming the nanocomposite to a ribbon geometry with a thickness of 10-35 microns. The actions include forming the first portion and second portions each to a planar geometry. In some examples, the nanocomposite includes 30 atomic % or less of Iron (Fe) or Nickel (Ni) and 50 atomic % or less of one or more metals selected from the group comprising boron (B), carbon (C), phosphorous (P), silicon (Si), chromium (Cr), tantalum (Ta), niobium (Nb), vanadium (V), copper (Cu), aluminum (Al), molybdenum (Mo), manganese (Mn), tungsten (W), cobalt (Co) and zirconium (Zr).

Details of one or more implementations are set forth in the accompanying drawings and the description below. Other features, objects, and advantages will be apparent from the description, the drawings, and the claims.

DETAILED DESCRIPTION

Figure 1:
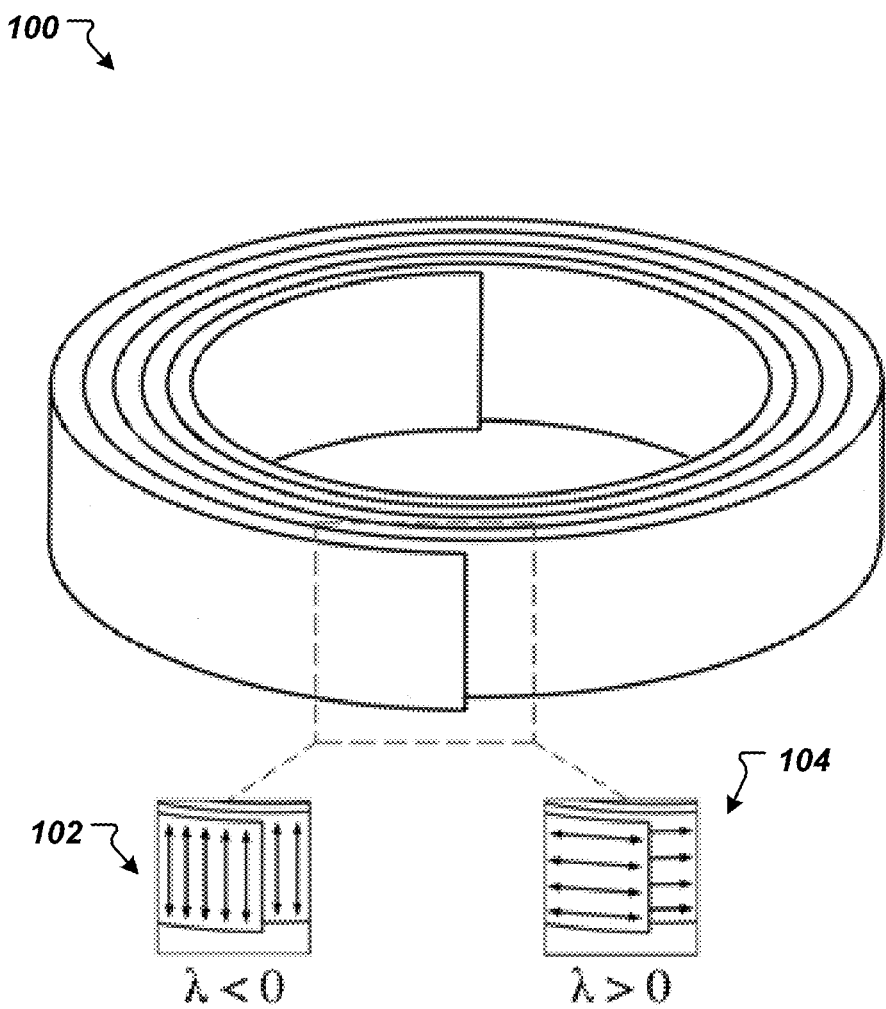
FIG. 1 is a diagram of domain orientations in a tape wound core.
Figure 2:
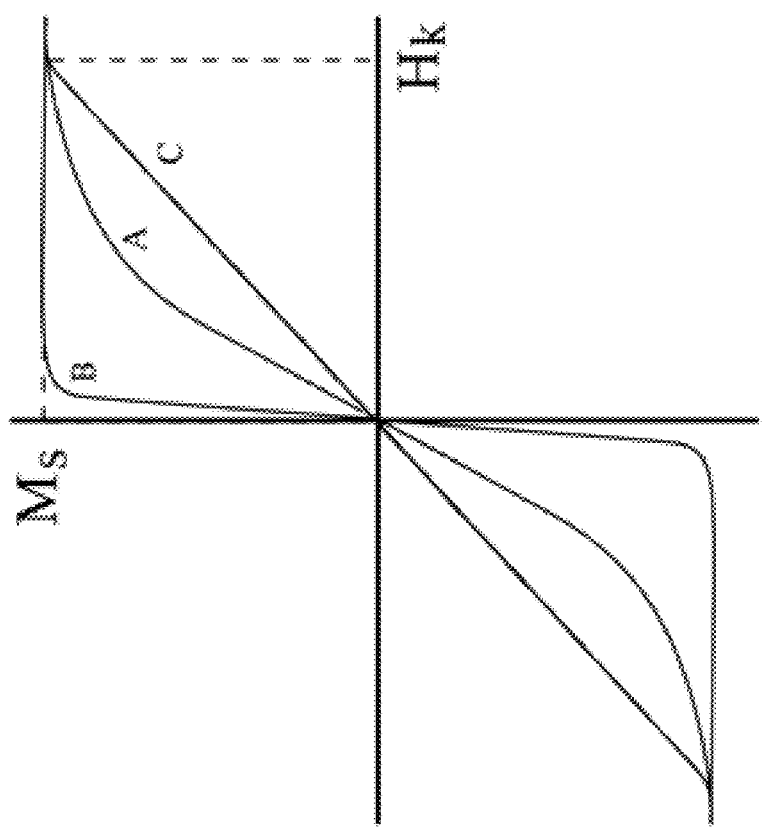
FIG. 2 is a diagram of magnetization vs. field curves for soft magnetic cores with varying induced magnetic anisotropies.
Figure 3:
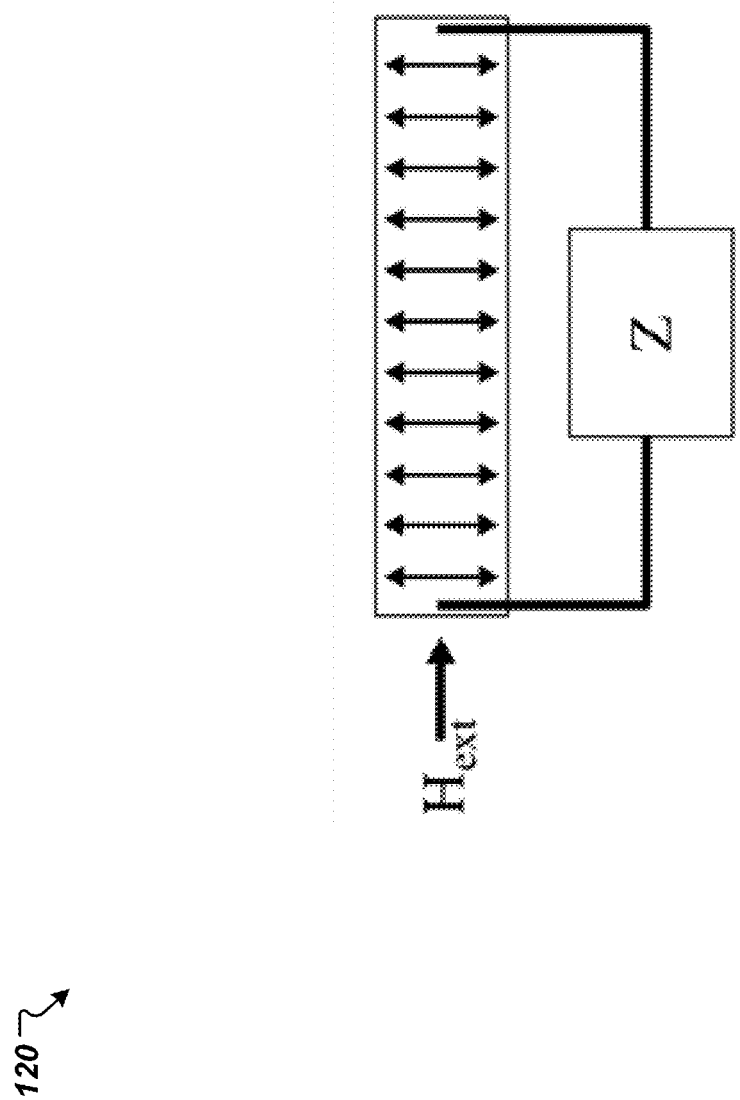
FIG. 3 is a diagram of preferred anisotropy direction for sensing element in a GMI sensor.

A nanocomposite soft magnetic alloy with tunable magnetic anisotropy, good thermal stability, and improved mechanical properties is described herein. Relevant alloys are Co-rich and include 30 atomic % or less of Iron (Fe) or Nickel (Ni) and 50 atomic % or less of one or more metals selected from the group comprising boron (B), carbon (C), phosphorous (P), silicon (Si), chromium (Cr), tantalum (Ta), niobium (Nb), vanadium (V), copper (Cu), aluminum (Al), molybdenum (Mo), manganese (Mn), tungsten (W), and zirconium (Zr). Amorphous precursors are created by a rapid quench technique and the nanocomposite is formed by thermal annealing under an applied strain field with or without an applied magnetic field. Tunable aniostropies may be created greater than 30 kJ/m³ and the direction of the induced anisotropy is controllable by adjustments to composition and annealing technique. Relevant applications of the material include inductors, sensors, and motors.

The techniques described herein enable the production and processing of soft magnetic nanocomposite materials with tunable anisotropies suitable for power electronic cores and for sensing elements in magnetic field sensors. The anisotropy induced by strain or field annealing is larger than anisotropies measured in other existing alloys and in strain annealing, requires less strain per unit of anisotropy. The induced anisotropy is tunable up to high energy densities that result in high or low permeabilities and is stable to high temperature. In addition to the requirement of lower stress per unit of induced anisotropy, the mechanical properties of the material are also improved compared to existing alloys that tend to become brittle after crystallization. These features overcome limitations in strain annealed Fe-based nanocomposite materials that become brittle during crystallization and limit the useful range of induced anisotropy.

In an example, Co-rich FeCo nanocomposite materials comprising a crystalline phase are embedded within an amorphous matrix that show a strong response to stress annealing with improved mechanical properties. These materials consist of compositions (TL-TE-M) involving combinations of late transition metals (TL), early transition metals (TE), and metalloids (M). The metalloids and early transition elements improve the material's glass forming ability and limit diffusion and grain size. By adjusting the composition and the annealing parameters, the size and structure of the nanocrystals may be refined resulting in optimal magnetic properties.

In both polycrystalline $Fe_{1-x}Co_x$ and amorphous $(Fe_{1-x}Co_x)_{80}B_{20}$ system, the sign of magnetostriction changes from positive to negative around 9:1 approaching the Co-rich compositions. (See O'Handley R C. Modern Magnetic Materials: Principles and Applications: Wiley Inter-Science, 1999.) Low loss materials require low magnetostriction so materials with small net positive or negative magnetostrictions are desired for strain annealing. Magnetostriction zero crossings exist in the Co-rich compositions of several ternary systems such as CoFeNi and CoFeMn. The net magnetostriction is the combination of the magnetostrictions of the amorphous and crystalline phases. Often the compositions of these phases differ from the master alloy composition due to partitioning during crystallization. The response of Co-rich nanocomposites to both field and stress annealing is very strong. In an example, a peak response to field annealing resulting in induced anisotropy ($K_u$) is above 2 kJ/m³ near x=0.97 in $(Fe_{1-x}Co_x)_{89}Zr_7B_4$. In another example, $K_u$ values approach 20 kJ/m³ in similar compositions using strain annealing. The strain annealing response of Co-rich nanocomposites is twice the strain annealing response measured in Fe-rich nanocomposite compositions as measured on a per-unit applied stress basis. Not only does a given stress level produce higher induced anisotropy in Co-rich materials, but higher induced anisotropies are also achievable. The Curie temperature of the amorphous phase in Co-rich alloys can exceed 600° C. compared to approximately 400° C. or less in Fe-rich compositions. Additionally, whereas most nanocomposite alloys to date are brittle following the annealing process, these alloys have improved mechanical properties and in particular strain to fracture.

In order to overcome the low thermal stability of amorphous materials, the nanocomposite form is preferred. These materials are formed by a devitrification of the amorphous precursor with suitable compositions to limit grain growth. The amorphous precursor is produced by a rapid solidification technique such as melt spinning or wire drawing. Co-rich nanocomposite alloys can undergo multiphase crystallization resulting in a mixture of body centered cubic (bcc), face centered cubic (fcc), and hexagonal close packed (hcp) grains. Enrichment in either Co, Fe, and/or the TE and M components of the composition cause fluctuations in local compositions compared to the nominal ingot composition. The zero crossing for magnetostriction in FeCo alloys occurs near 91% Co and serves as a guideline for composition and processing decisions depending on the desired application. Suitable choice of composition and annealing procedures result in anisotropy energy densities above 20 kJ/m³ corresponding to relative permeabilities below ~20.

Figure 4:
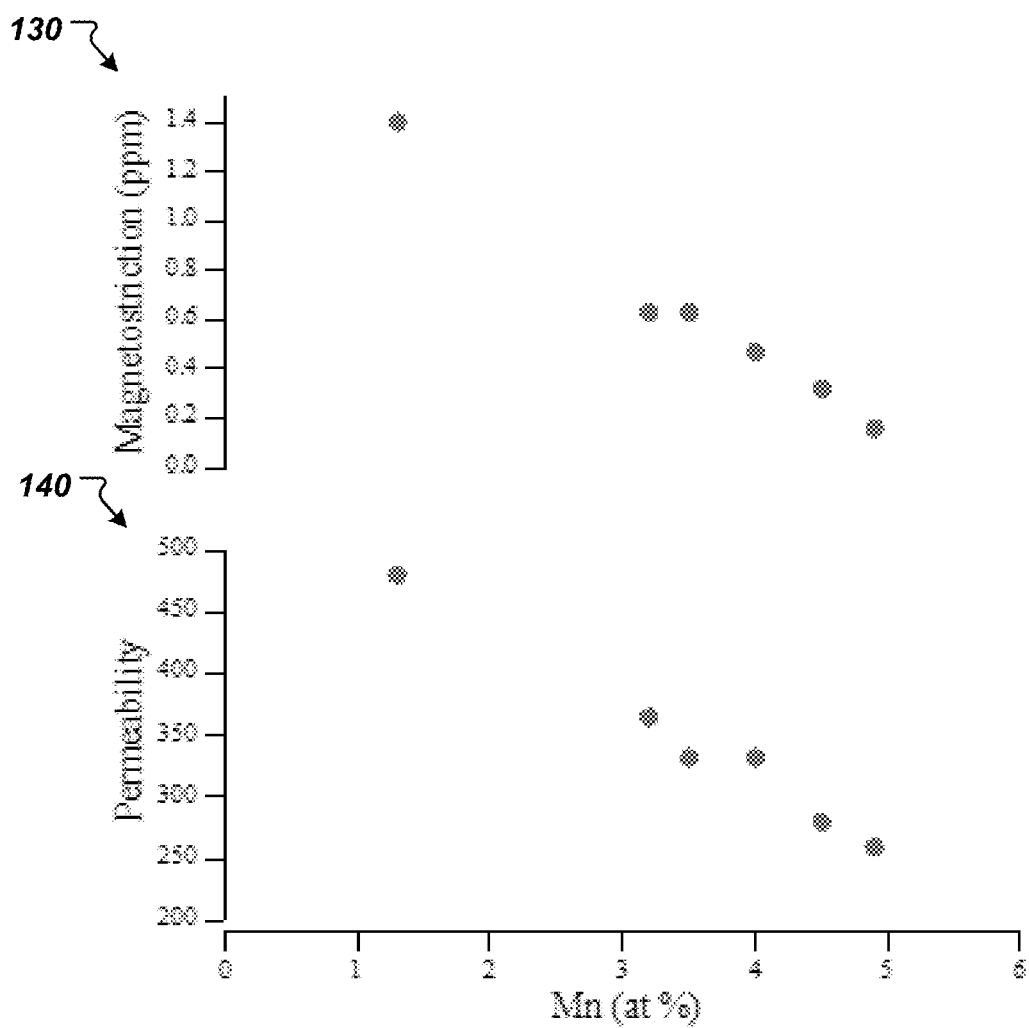
FIG. 4 is a diagram of the effects of magnetostriction on the induced anisotropy in strain annealed ribbons . . .

Referring to FIG. 4, diagram 130 shows the effect of magnetostriction on the induced anisotropy in strain annealed ribbons. Increasing manganese (Mn) content in a composition with near zero magnetostriction in the amorphous phase ($Co_{77.2}Fe_{1.4}Mn_{1.4}Nb_4B_{14}Si_2$) results in decreasing positive magnetostriction in the nanocomposite after annealing under similar conditions without strain. Here, the composition varies as $Co_{77.2-x}Fe_{1.4}Mn_xNb_4B_{14}Si_2$ and control of the magnetostriction through alloy composition allows for tunable permeability materials. Diagram 140 shows the relationship between permeability and Mn content. As shown, as the percentage of Mn increases, the permeability decreases.

Figure 5:
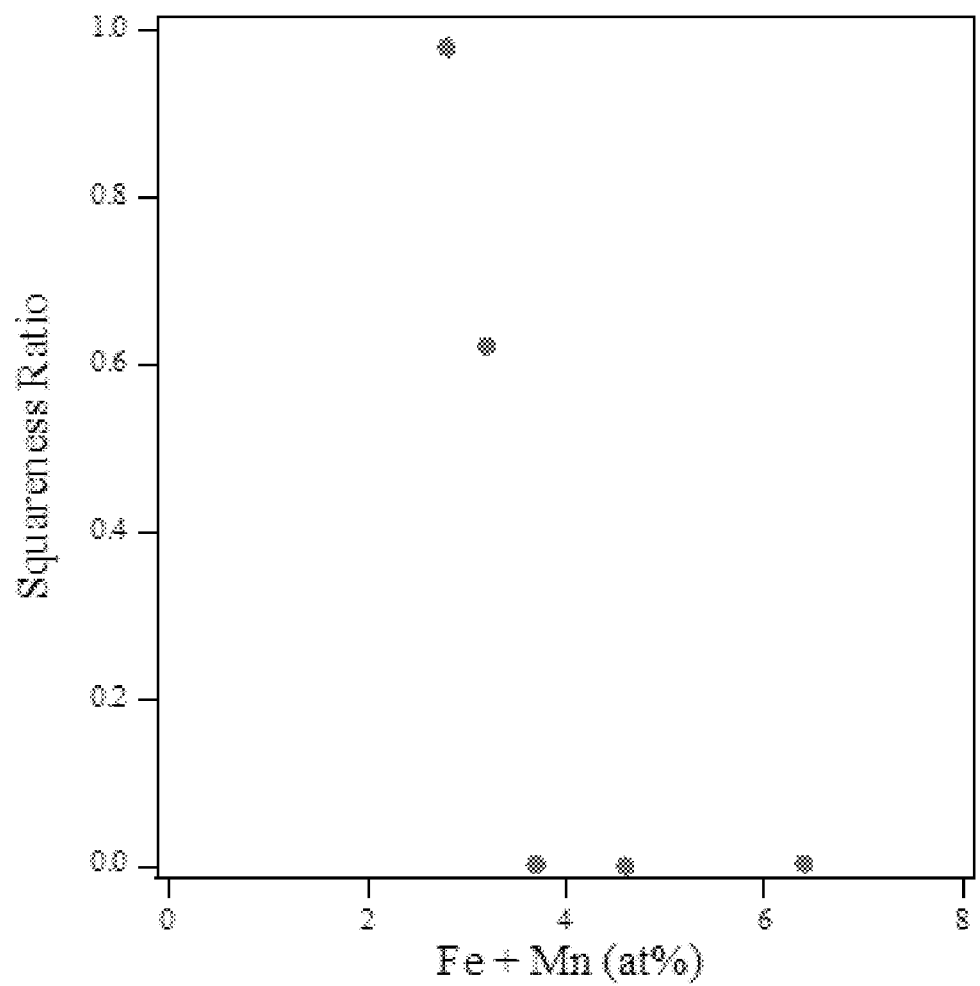
FIG. 5 is a diagram of squareness ratio vs. iron and manganese composition.

Referring to FIG. 5, diagram 150 illustrates the squareness ratio vs. iron and manganese composition in the $Co_{77.2-2x}(FeMn)_xNb_4B_{14}Si_2$ alloy series as a result of strain annealing. Squareness is the ratio of the remanent induction to the saturation value. Materials with squareness values approaching unity have high permeabilities and materials with low squareness have low permeability. As shown, both high and low permeability material can be created by composition adjustment in Co-rich strain annealed materials.

Figure 6:
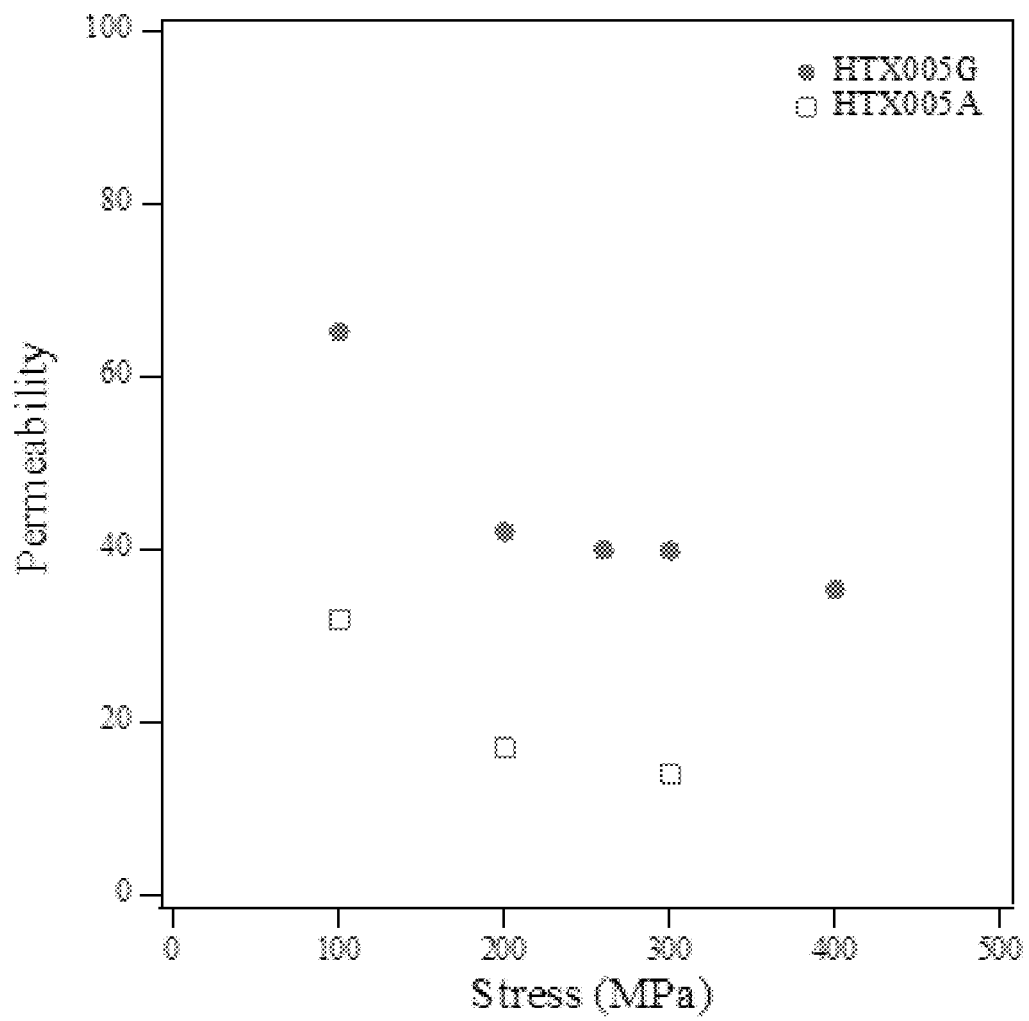
FIG. 6 is a diagram of the effects of stress on permeability.

Referring to FIG. 6, diagram 160 shows the permeability achieved after strain annealing in compositions with different Fe and Mn content at different stress levels. Lower permeability is achieved in $Co_{73.6}Fe_{3.2}Mn_{3.2}Nb_4B_{14}Si_2$ (HTX005A) compared to $Co_{75.4}Fe_{2.3}Mn_{2.3}Nb_4B_{14}Si_2$ (HTX005G) and permeability initially decreases rapidly with stress until approximately 200 MPa at which level the dependence becomes weaker. The relationship between increasing stress and decreasing permeability is a general one that is observed ubiquitously. Here, tunable permeability is also achieved by adjusting processing conditions during strain annealing.

Figure 7:
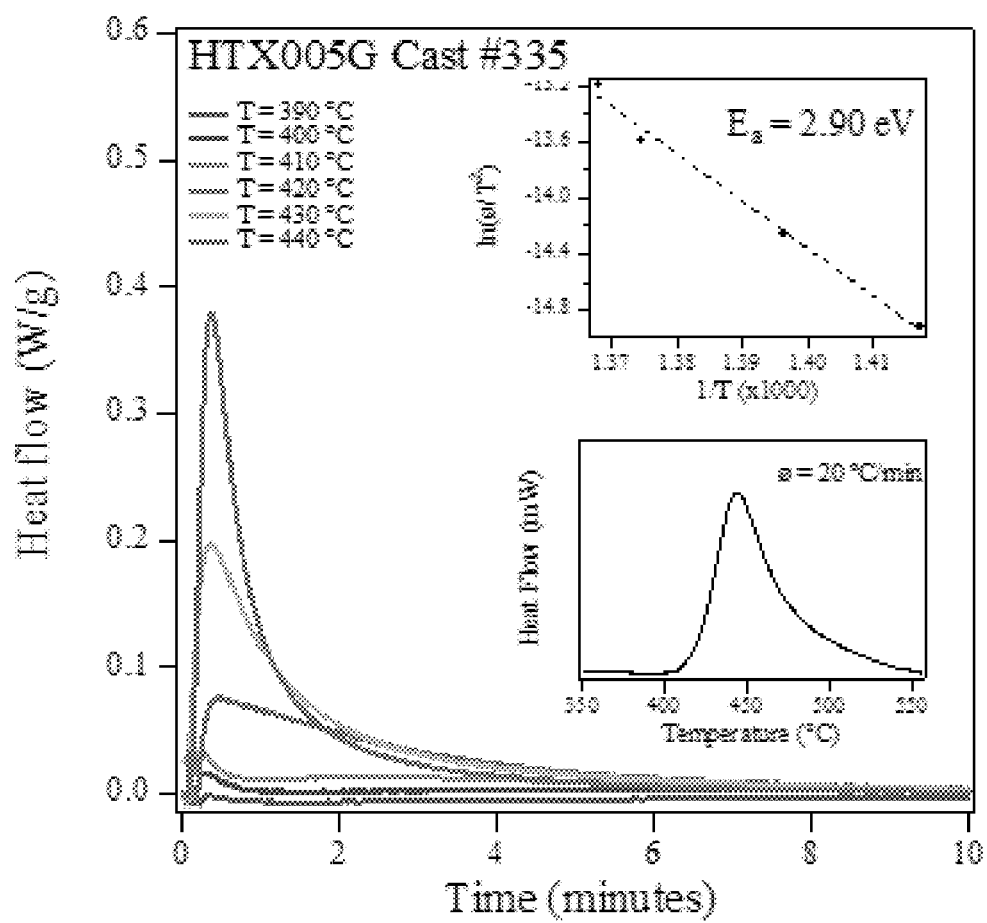
FIG. 7 is a diagram of isothermal differential scanning calorimetry.
Figure 8:
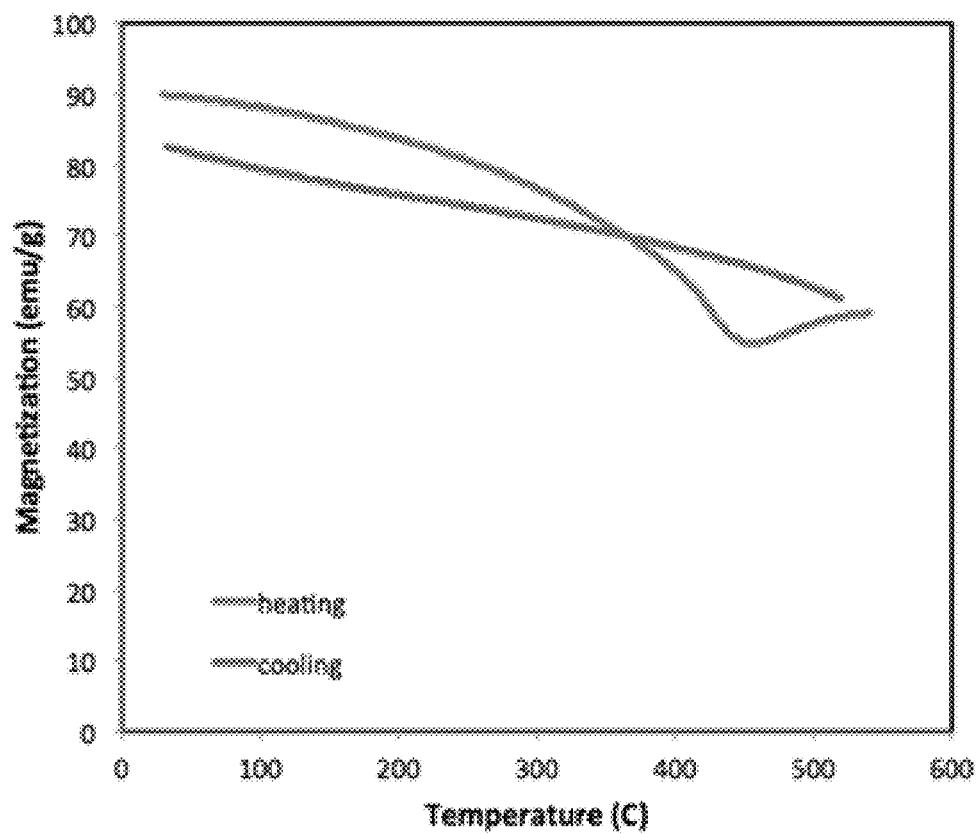
FIG. 8 is a diagram of magnetization vs. temperature for heating and cooling of a cast material.

It is advantageous for the crystallization process to occur quickly in strain annealing to allow for high production rates. Referring to FIG. 7, diagram 170 shows differential scanning calorimetry data for $Co_{75.4}Fe_{2.3}Mn_{2.3}Nb_4B_{14}Si_2$, which can provide an indication of the onset and completion of crystallization. The data demonstrates that the onset of crystallization in constant heating rates occurs at 420 C and is largely independent of the heating rate. Isothermal heating results shown in FIG. 7 shows the decrease in required time to complete the crystallization process at different temperatures and illustrates that for certain temperatures the crystallization can begin and complete within seconds which is compatible with requirements imposed by production scale-up. Crystallization can also be measured magnetically, as in diagram 180 FIG. 8. Here, a $Co_{75.4}Fe_{2.3}Mn_{2.3}Nb_4B_{14}Si_2$ as-cast sample is heated and magnetization monitored as a function of temperature in a vibrating sample magnetometer. The high Curie temperature of the amorphous phase is evident and the crystallization process is measured as the increase in magnetization during heating. The phase identity of the crystalline phase is highly faulted close packed crystals with an average size of approximately 5 nm as shown in FIGS. 11-12.

Figure 9:
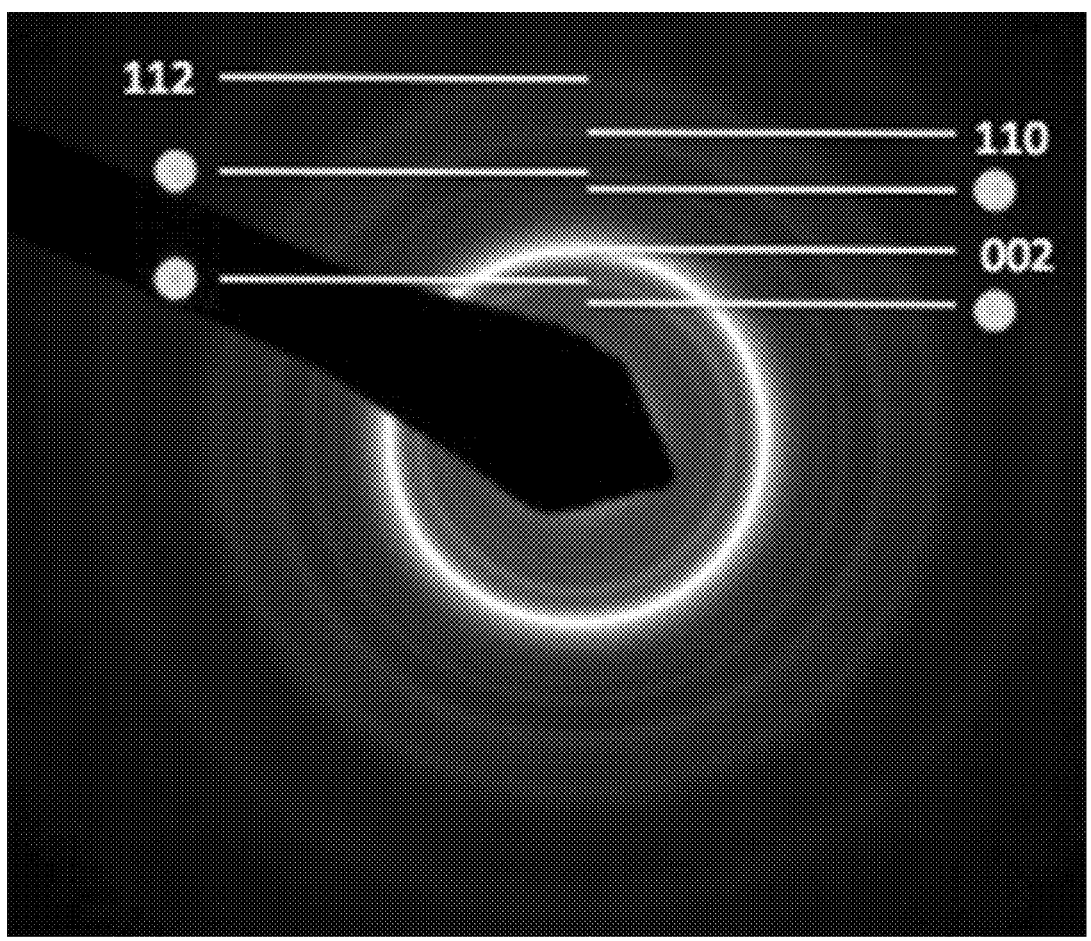
FIG. 9 is a diagram of an electron diffraction pattern of HTX005 g annealed for 1 hour at 520° Celsius.

Referring to FIG. 9, diagram 190 illustrates an electron diffraction pattern of $Co_{75.4}Fe_{2.3}Mn_{2.3}Nb_4B_{14}Si_2$ annealed for 1 hr at 520° Celsius without applied stress. The pattern shows diffraction rings corresponding to scattering from randomly oriented close packed reflections. Sharp reflections exist for planar spacings corresponding to H−K=3N in the hcp HKL lattice. The first three such rings, {002}, {110}, and {112}, correspond to the hcp lattice with a=2.51 Å and c=4.08 Å. These rings can also be described using {111}, {022}, and {113} planes in the fcc lattice respectively with a lattice constant of 3.54 Å. These reflections are consistent with planar faulting in close packed structures. The additional rings annotated with green circles in FIG. 9 are thought to match reflections from multiple planar spacing resulting from planar defects.

Figure 10:
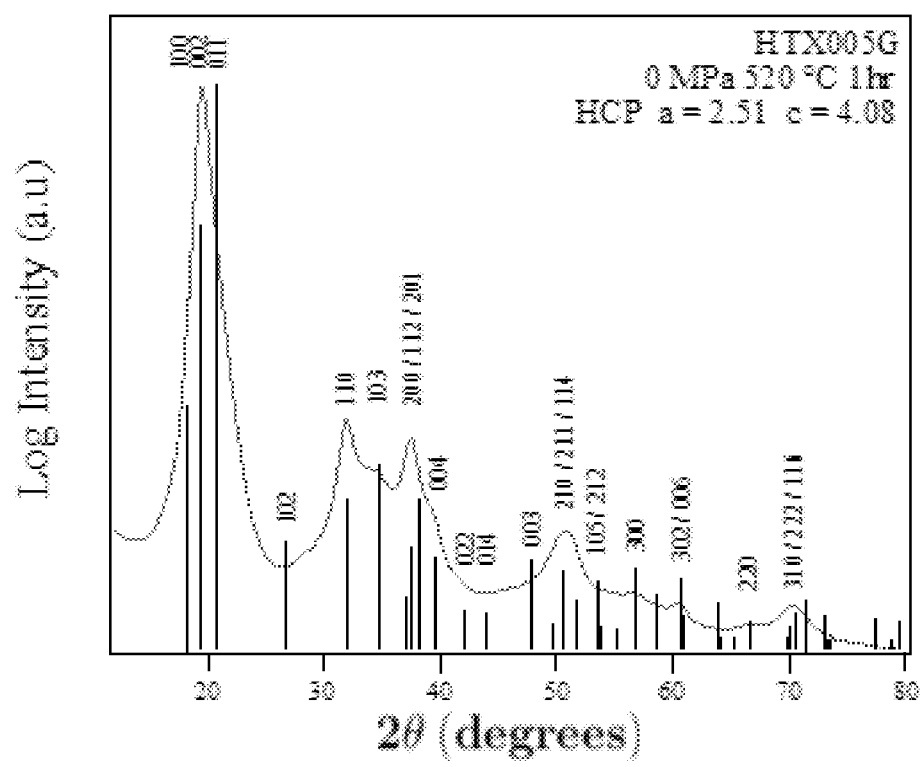
FIG. 10 is a diagram of x-ray diffraction pattern of HTX005 g annealed for 1 hour at 520° Celsius.

Referring to FIG. 10, diagram 200 illustrates an x-ray diffraction pattern of $Co_{75.4}Fe_{2.3}Mn_{2.3}Nb_4B_{14}Si_2$ annealed for 1 hr at 520° Celsius. This pattern shows structure data to higher order than measureable by electron diffraction and the indexed notation shows planar locations corresponding to the hcp lattice. The sharp peaks in FIG. 10 also appear at reflections satisfying H−K=3N in the hcp lattice and the additional higher order reflections measured by electron diffraction are not present. This is attributed to a higher sampling volume in the x-ray experiment compared to the electron experiment.

Figure 11:
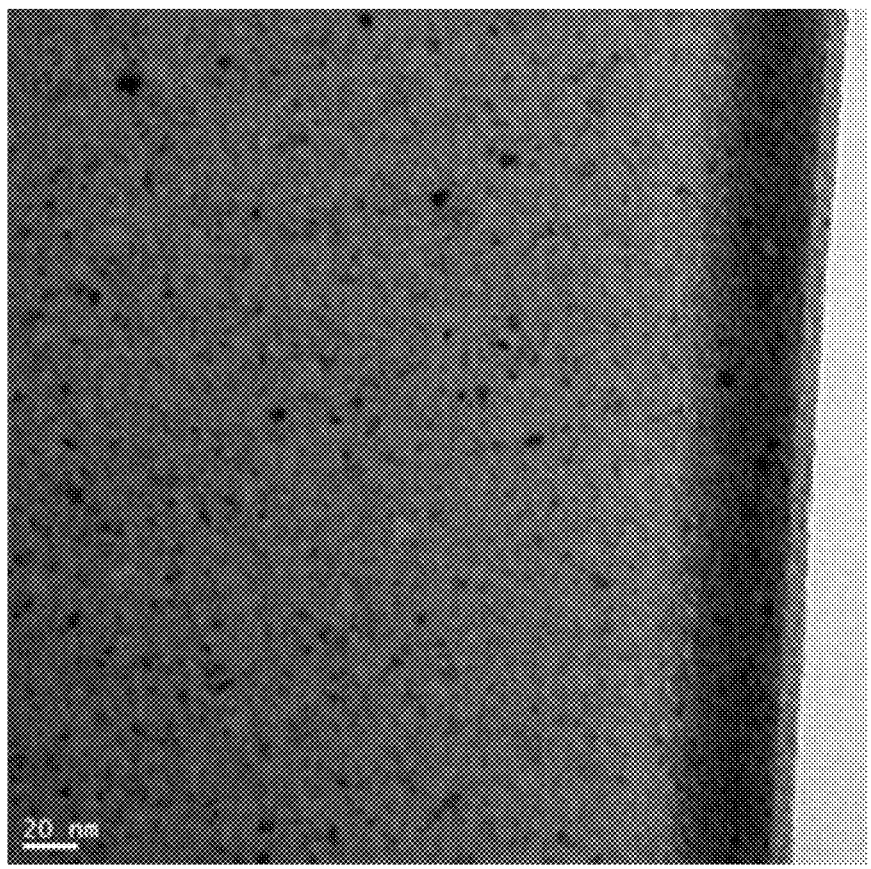
FIG. 11 is a diagram of a conventional transmission electron microscopy image of $Co_{75.4}Fe_{2.3}Mn_{2.3}Nb_4B_{14}Si_2$ annealed for 1 hour at 520° Celsius.
Figure 12:
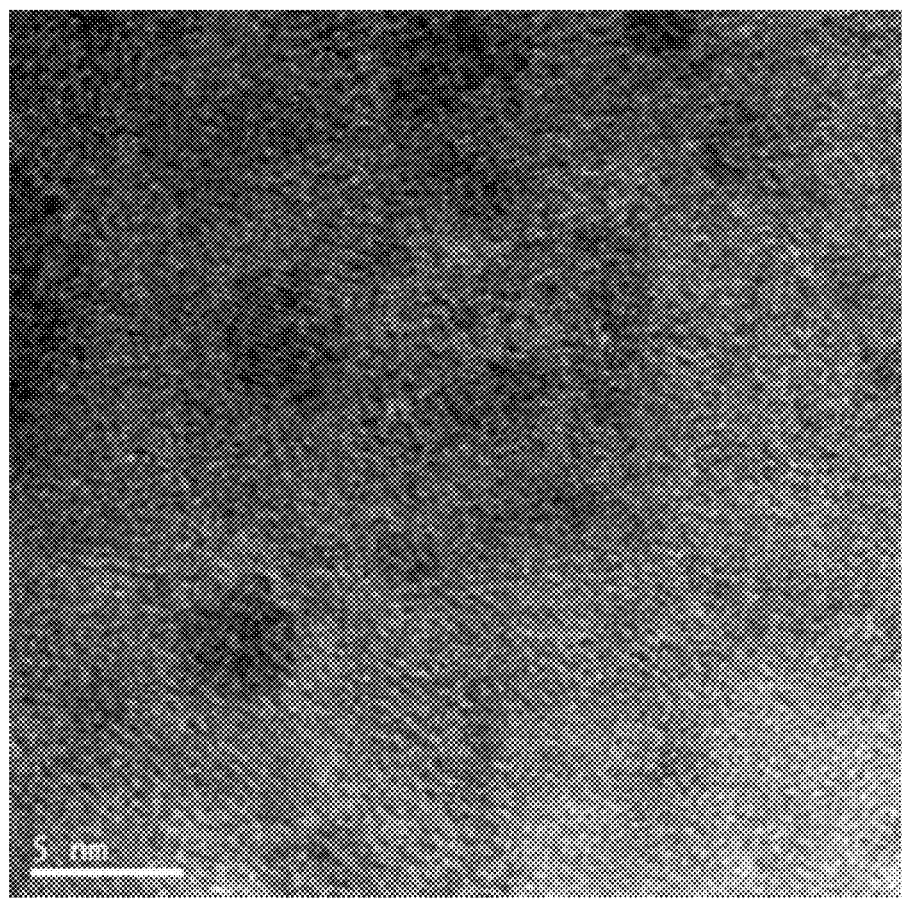
FIG. 12 is a diagram of a high resolution transmission electron microscopy image of $Co_{75.4}Fe_{2.3}Mn_{2.3}Nb_4B_{14}Si_2$ annealed for 1 hour at 520° Celsius.

Referring to FIG. 11, diagram 210 illustrates a conventional transmission electron microscopy image of $Co_{75.4}Fe_{2.3}Mn_{2.3}Nb_4B_{14}Si_2$ annealed for 1 hr at 520° Celsius. The fine grain structure is required for low coercivity and allows for higher temperature stability compared to amorphous alloys. The onset of crystallization occurs near 420° Celsius and the average grain size is below 10 nm.

Referring to FIG. 12, diagram 220 illustrates a high resolution transmission electron microcopy image of $Co_{75.4}Fe_{2.3}Mn_{2.3}Nb_4B_{14}Si_2$ annealed for 1 hr at 520° Celsius. FFT analysis of lattice fringing confirms the close packed structure and areas containing stacking faults are evident.

The magnetic material is formed by rapid solidification from pre-alloyed ingots with compositions based on Co, containing 30 atomic % or less Fe and/or Ni, and 50 atomic % or less of one or more metals selected from the group comprising boron (B), carbon (C), phosphorous (P), silicon (Si), chromium (Cr), tantalum (Ta), niobium (Nb), vanadium (V), copper (Cu), aluminum (Al), molybdenum (Mo), manganese (Mn), tungsten (W), and zirconium (Zr).

The amorphous precursor undergoes strain annealing, a processing technique in which a stress field is applied to the ribbon at a desired temperature for a desired duration of time. The product of strain annealing is a nanocomposite consisting of crystallite particles of nanometer size scale embedded in the residual amorphous matrix. The strain annealed nanocomposite ribbon exhibits magnetic anisotropy.

The induced anisotropy is tuned by varying the applied stress during the annealing process and the anisotropy response is linear with stress to a threshold value that varies for each alloy. In some alloys, stresses may be applied up to 1 GPa without material failure resulting in low permeabilities for Co-rich compositions with negative magnetostrictions.

Low permeability level (100 to 15) combined with flat B-H loop and low watt loss allows application of the claimed material in various inductors and energy storage devices instead of powder cores or gapped cores. In contrast with powder cores, the tape wound cores made of the Co-rich alloys can be wound practically of any size, whereas powder core size usually is not more than about 6-8 in., and limited by required compaction pressure and strength of die tool steel. Gapped cores have significant fringing flux that causes additional watt loss, heating of adjacent metallic parts, and EMI/RFI problems, in contrast with gapless tape wound cores made of strain annealed claimed Co-rich alloys.

Surface roughness in the sensing element leads to anomalous losses that degrade sensor performance. Coating of a conductive material to reduce surface roughness of the ribbon reduces stray fields caused by surface roughness and improves sensor performance.

The field sensitivity peak for GMI sensors occurs when the external field approaches the level of the induced anisotropy field. Larger anisotropy fields in the strain annealed Co-based alloys described above allow for wider and tunable ranges of sensor operation in GMI sensors that employ these materials as sensing elements in ribbon or wire form. Similarly, tunable permeability in inductor cores is advantageous to tailor a magnetic material to a particular application. Low permeability cores exhibit significant advantages for applications requiring high power transformation and large stored energies. The larger anisotropy fields in the strain annealed alloys described above allow for lower and tunable permeabilities for such applications.

Figures 13A, 13B:
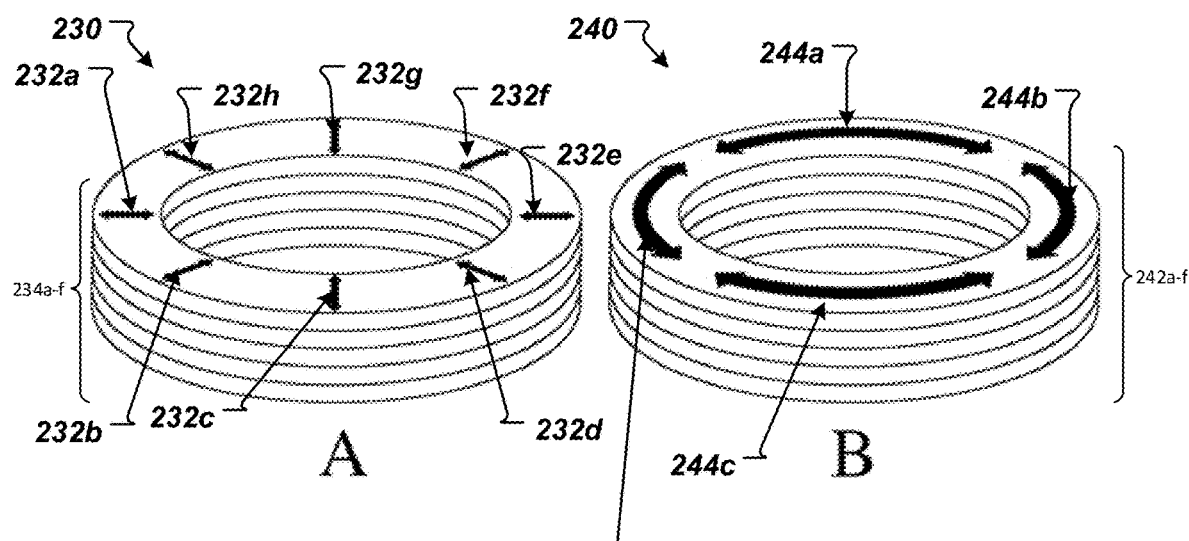
FIGS. 13A-B are diagrams of ring cores formed by stacked annular discs with radial and circumferential anisotropy.

Referring to FIG. 13A, diagram 230 illustrates that radial anisotropies 232a-232h in stamped discs 234a-f result from combined hoop and radial stresses formed during annealing and/or cooling. The stress state created during annealing may be influenced by centripetal forces induced by rotating annular discs in a furnace. The choice of composition and processing method depends on the geometry of the desired component. Alloys that develop an easy axis perpendicular to the stress axis, such as $Co_{75.4}Fe_{2.3}Mn_{2.3}Nb_4B_{14}Si_2$, result in anisotropy shown in FIG. 13A from such a treatment whereas alloys that develop an easy axis parallel to the stress axis, such as $Co_{77.2}Fe_{1.4}Mn_{1.4}Nb_4B_{14}Si_2$, would develop anisotropy as shown in FIG. 13B. The stamping of discs as in FIG. 13A with radial indentations confine eddy currents in a manner analogous to laser scribing of Silicon steels.

Referring to FIG. 13B, diagram 240 illustrates that circumferential anisotropies 244a-244d in stamped discs 242a-f result from combined hoop and radial stresses formed during annealing and/or cooling, where the sign of the magnetostriction coefficient is changed. The choice of composition and processing method depends on the geometry of the desired component.

In an example, a material includes cobalt (Co), 30 atomic % or less of Iron (Fe) or Nickel (Ni) and 50 atomic % or less of one or more metals selected from the group comprising boron (B), carbon (C), phosphorous (P), silicon (Si), chromium (Cr), tantalum (Ta), niobium (Nb), vanadium (V), copper (Cu), aluminum (Al), molybdenum (Mo), manganese (Mn), tungsten (W), and zirconium (Zr). In this example, the material has a composite structure with crystalline grains less than approximately 50 nanometers in average diameter embedded within an amorphous matrix. Compared to the nominal composition, the amorphous matrix that surrounds the grains becomes enriched in early transition metals and limits further grain growth during crystallization. The material is formed through a thermo-mechanical process that results in an amorphous precursor material and includes at least one mechanical operation and at least one thermal operation. The mechanical operation is also performed under elevated temperature conditions.

In this example, at least one thermal operation comprises a rapid solidification operation that includes formation of amorphous wires and/or ribbons by melt-spinning with and without glass coating, in-rotating water spinning, sputtering, and electrodeposition (see Phan, et al. Prog. Mat. Sci. 53 (2008). Raw materials used to create the desired composition should be of sufficient quality to limit impurities and can be in powder, ingot, or crushed ingot forms. Melt spinning is a technique used for rapid cooling of liquids. A wheel is cooled internally, usually by water or liquid nitrogen, and rotated. A thin stream of liquid is applied to the wheel either by jet casting a free stream or through a confined puddle formed between the nozzle and wheel surface and cooled, causing rapid solidification. This technique is used to develop materials that require extremely high cooling rates in order to form, such as metallic glasses. The cooling rates achievable by melt-spinning are on the order of $10^4$-$10^7$ kelvins per second (K/s).

In another example, at least one mechanical operation comprises application of a tensile strain along a longitudinal axis of a ribbon or a wire, during an elevated temperature annealing treatment above approximately 200° Celsius to control a permeability of the material. In this example, the applied tensile strain is less than approximately 350 megapascal (MPa) and an effective induced anisotropy is tunable up to 29 kJ/m$^3$. In this example, a resulting anisotropy energy density per megapascal (MPa) of the applied tensile strain is greater than $$96 \frac{J/m^3}{MPa}.$$

This sensitivity to strain annealing attractive compared to $$10\text{-}25 \frac{J/m^3}{MPa}$$

in FeSiNbBCu nanocomposites. Additionally, FeSiNbBCu ribbons become brittle following crystallization and tend to fracture at low stresses (above 100 MPa), complicating strain annealing of these materials.

In another example, the material is included in a magnetic sensing material, an inductor, or a motor design. The fine grain structure in the nanocomposite averages the magnetocrystalline anisotropy between adjacent grains and leads to low coercivity. Low coercivity allows for low loss switching in inductive applications.

In another example, the material is annealed in a magnetic field with applied stress. Here, the material is supported in a magnetic field that is oriented in a desired direction while the sample is heated to through the chosen annealing profile. The ribbon can be wound into a core or unwound depending on the desired application.

In still another example, the material (from which the nanocomposite is made) is formed from an alloy that is dilute or substantially free of hafnium (Hf), zirconium (Zr), and titanium (Ti). These elements oxidize easily and greatly complicate planar flow casting where the casting atmosphere contains moderate amounts of oxygen. Typically, planar flow casting of compositions with Hf, Zr, and/or Ti require the entire casting process to be contained within a vacuum chamber, which significantly increases production cost and complexity. In still another example, the alloy is an as-cast alloy, and an amorphous precursor of the as-cast alloy has a Curie temperature greater than approximately 600° Celsius. The Curie temperature of the amorphous matrix is typically lower than the Curie temperature of the crystalline grains. Operating temperatures approaching the amorphous phase Curie temperature result in increased coercivity and higher losses as the random anisotropy between grains breaks down. Generally, an as-cast material is material in ribbon or wire form that is mostly or wholly amorphous that is the precursor material to the annealing treatment necessary to form the nanocomposite.

In still another example, the nanocomposite with the tunable anisotropy is used as a magnetic field sensor in a sensing element, an inductor core, or a transformer. The tunable anisotropy affects the magnetic permeability of the nanocomposite, making the nanocomposite well suited for use as a magnetic field sensor. Permeability controls the skin depth, the saturation point of the material, and the dynamic magnetization mechanism and the ideal level depends on the application. Sensors that rely on Giant Magnetoimpedance (GMI) are sensitive to changes in skin depth over a limited frequency range and the ability to induce well defined anisotropy leads to high sensitivity at fields near the induced anisotropy field. The fluxgate magnetometer design uses a soft magnetic core that is alternately driven to saturation by a drive coil and is sensitive to the saturation point. When placed in an external field, the core saturates asymmetrically producing even harmonics proportional to the field strength according to Faraday's law. All sensor performance is dictated by the signal to noise level and Barkhausen noise arising from random domain wall movements is a significant noise source in magnetic sensors. Induced anisotropies control the magnetization mechanism by reducing domain wall motion and increasing magnetization changes by rotation. Because the ideal permeability for a magnetic field sensor depends upon the specific application and the type of device employed, the ability to tune induced anisotropies over a large range with resultant linear hysteresis loops allows for a broad range of applications and enhanced device compatibility.

In an example, the nanocomposite materials described here have increased ductility, relative to other soft magnetic nanocomposite materials. Generally, ductility is a solid material's ability to deform under tensile stress and ductility in ribbon form is generally determined by a simple bend test. Although the mechanistic origin of an enhanced mechanical ductility for high Co-containing nanocomposite alloys as compared to Fe-rich alloys has not yet been elucidated, it has been demonstrated empirically for a number of different alloy systems. In this example, the nanocomposite material is capable of being stamped for use in one or more of a motor stator and a rotor. The lower losses in the nanocomposite material allows for higher switching frequencies and speeds than is capable in Si-steel rotors. Suitable designs also may lead to higher efficiency. In this example, the nanocomposite material in the motor stator or in the rotor is capable of operation at approximately 200° Celsius. This is above the useful range of amorphous materials and is attributed to the higher Curie temperature and stability of the nanocomposite structure.

In an example, the material is capable of being planar flow cast without a protective vacuum. Planar flow casting within a protective vacuum chambers is required when the composition is highly sensitive to oxidation so the process is conducted in a carefully controlled atmosphere.

In still another example, the nanocomposite material is a wire in a sensing element that is included in a wirelessly interrogable device, such as a wirelessly interrogable acoustic sensor.

In still another example, the material in the wire form is capable of operation at temperatures above 150° Celsius. Amorphous materials tend to change structure and properties near this temperature and are not suited for long term, high temperature use at such elevated temperatures. Fe-rich nanocomposite alloys tend to have relatively low Curie temperatures of the amorphous phase which impart a strong temperature dependence of the response which is not desirable for a high temperature sensing device.

Figure 14:
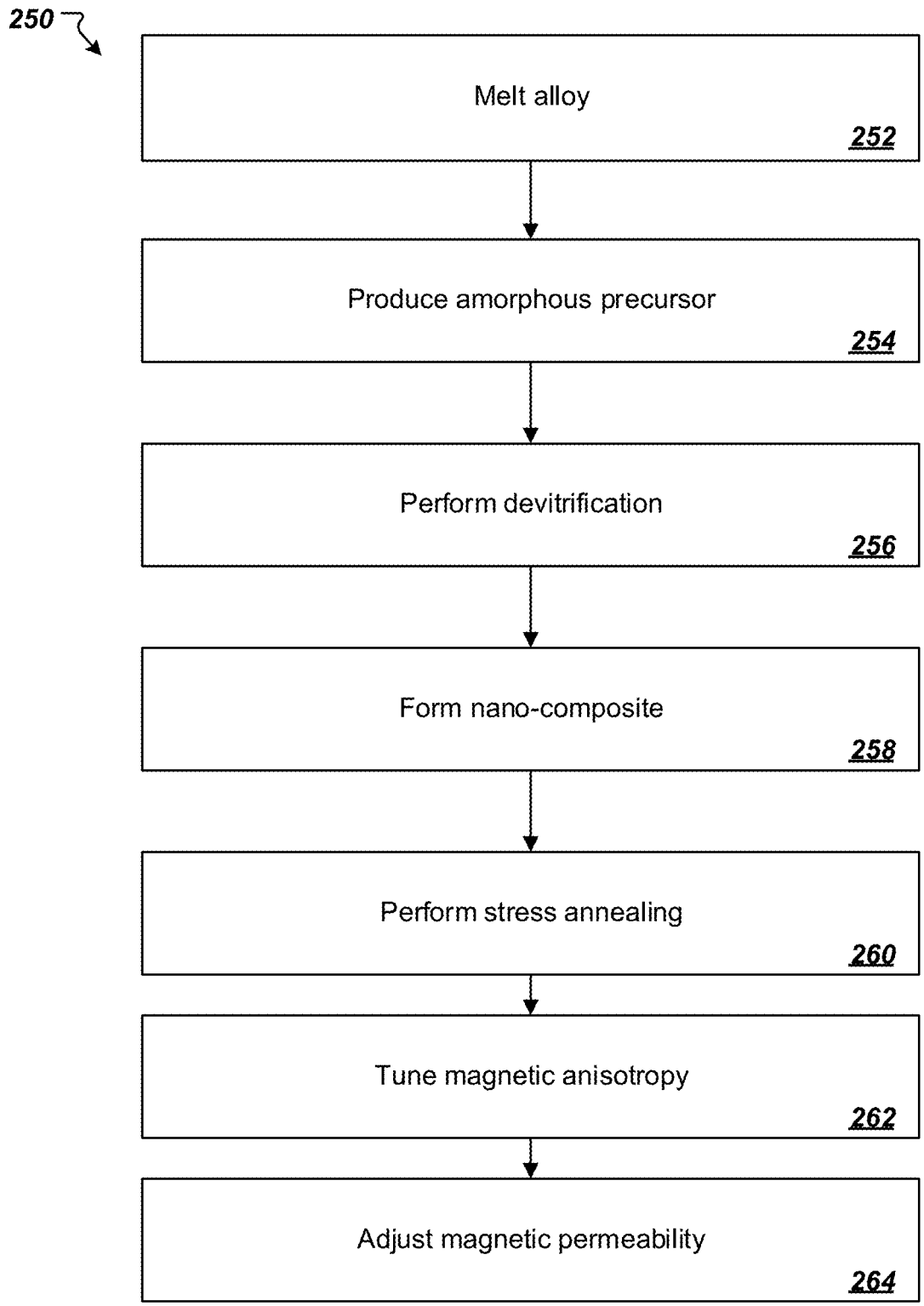
FIGS. 14-15 are diagrams each showing a flow chart of a process for tuning anisotropies.

Referring to FIG. 14, one or more entities perform process 250 to tune anisotropy of a Co-based nanocomposite. For example, an entity could be a manufacturer of an inductor or a manufacture of the nanocomposite material. In operation, an alloy is melted (252). There are various types of alloys that may be used, including, e.g., iron, cobalt, nickel, and so forth. The melted alloy is solidified to produce (254) an amorphous precursor to a nanocomposite, with the amorphous precursor comprising a material without crystals. Various different types of solidification techniques may be used, including, e.g., casting onto a rotating copper wheel or drawing wire from a melt. Devitrification is performed (256) on the amorphous precursor, wherein the devitrification comprises a process of crystallization. The process also includes forming (258), based on the devitrification, the nanocomposite with nano-crystals.

In this example, the process also includes performing stress annealing (260) on the nanocomposite to modify the nano-crystals. There are various ways in which stress annealing is performed, e.g., pulling the material (in ribbon form) through a furnace, spreading the material out with heat and stress, applying lubricated thermal blocks to the ribbon, and other techniques for applying heat to the ribbon to promote crystallization in a particular geometry. In this example, the process includes tuning (262), based on an amount of stress annealing, a magnetic anisotropy of the nanocomposite. In this example, there is a linear relationship below a limiting threshold between the amount of stress annealing and the amount of induced magnetic anisotropy. That is, the tensile stress imparts the magnetic anisotropy, which in turn affects the magnetic permeability of the nanocomposite material. In this example, the process includes adjusting (264) the magnetic permeability of the nanocomposite material, e.g., to a level that is satisfactory for use of the nanocomposite material as a magnetic sensing element. Amorphous structures are metastable and the local stress and magnetic field present during crystallization determines the structure that results in the lowest energy following crystallization. Annealing without applied stress or a magnetic field results in a mainly isotropic structure. Annealing with a global stress and/or magnetic field results in pair ordering, preferred orientations of atoms/defects, and/or residual stress that remains at operating temperatures. All mechanisms can lead to magnetic anisotropy by non-uniform magnetocrystalline anisotropy and/or coupling to stress through non-zero magnetostriction. In another example, after formation of the amorphous precursor (by melt spinning, a powder method, or wire drawing), the material is devitrified under stress (e.g., via stress crystallization) with or without an applied field.

In some examples, the nanocomposite material includes a soft magnetic core. Such a nanocomposite material can included concentrated lines of magnetic flux for inductive applications. For example, a periodic distribution of high and low permeability can be generated, and when wound into a core would leave one permeability material at straights and another at bends. The periodic distribution of high and low permeability can be used for controlling hot spots in the excited core. In some examples, the soft magnetic core includes a flux concentration. The flux concentration can vary in the nanocomposite material, such as when the nanocomposite material includes a uniform or near uniform magnetic permeability. The variations in the flux concentration can occur due to the application of a non-uniform magnetic field, a shape of the magnetic core, a geometric configuration of the magnetic core, or other variations in the nanocomposite material. In some examples, a flux concentration in the nanocomposite material causes higher losses core losses in inductive applications and reduce the effectiveness of the sensor.

Core materials with a tunable permeability can be used to balance the flux level within the core to reduce flux concentrations. In some examples, a variable permeability core with radially controlled permeability can be constructed. In some examples, the variable permeability core is constructed from stress-annealed Fe-rich powder, Fe-rich metal ribbon, and so forth. In some examples, different materials are used for different magnetic permeability goals. For example, Fe-rich powder can be used for magnetic permeabilities tuned under a value of 50. For example, stress-annealed Fe-rich nanocomposite ribbons can be used for magnetic permeabilities tuned over a value of 50. Further examples of Fe-rich nanocomposites are described in U.S. Patent Publication No. 2015/007124, incorporated herein in its entirety. In some examples, Co-rich nanocomposites can be used for inductive applications and can have tunable magnetic permeabilities. For example, Co-rich nanocomposites can have higher stress-induced anisotropies than Fe-rich nanocomposites. In some examples, the Co-rich nanocomposite can have a soft magnetic core having a variable permeability with a value of 4. Further examples of Co-rich nanocomposites are described in relation to U.S. Patent Publication No. 2014/0338793.

In some examples, the described Co-rich nanocomposite compositions include high-permeability core sections that are incorporated into the soft magnetic core. For example, the soft magnetic core can include a square hysteresis loop. In some examples, a nanocomposite having a square hysteresis loop in the soft magnetic core is produced by longitudinal field annealing using two steps to produce a balanced flux. The longitudinal configuration produces an imbalanced flux concentration after the first field annealing during the first winding of a tape-wound core. In some examples, a second annealing can be used during a second winding of the tape-wound core in which the tape-wound core is wound in reverse order so that the material that was on the inside of the core is on the outside during the second winding. The tape-wound core is annealed a second time to balance the flux concentration in the soft magnetic core. In some examples, stress annealing in a Co-rich nanocomposite can include production of a tape-wound core having a soft magnetic core with a balanced flux concentration by using a single winding instead of two windings. A square-loop core material can be produced by tuning the local permeability as desired to a constant or variable value. Other examples of stress annealing a Co-rich nanocomposite can be found in U.S. Patent Application 2104/0338793, incorporated herein in its entirety.

Tape-wound core nanocomposites can include continuous sections of strain-annealed ribbon wherein the local permeability of each ribbon section is determined by the time, temperature, and applied tension to the tape-wound core while the tape-wound core is passing through a heating device. The heating device can include one or more heated thermal blocks between which the tape-wound core can pass during heating. In some examples, such application of stress annealing can result in a more balanced flux concentration throughout the core volume. Wound cores may also be constructed from non-continuous sections of ribbon without significant degradation in properties. For example, several pieces of the Co-rich nanocomposite can be fused or otherwise attached together to form a tape-wound core nanocomposite material.

In some examples, the tape-wound core can have a local permeability tuned in the ribbon. The tuning of the magnetic permeability can be controlled to a descried level by varying one or more of the temperature of the one or more heated thermal blocks. The tuning can be controlled by adjusting a magnitude of the tension applied or a magnitude of the magnetic field applied to the ribbon during annealing. In some examples, the tuning can be controlled by adjusting the direction of the applied tension or the direction of the applied magnetic field during annealing with respect to the ribbon. In some examples, the tuning can be controlled by adjusting the exposure time of the moving ribbon to the thermal blocks. The exposure time can be adjusted by varying the speed of the ribbon moving between the thermal blocks or the length of one or more of the thermal blocks.

The magnetic permeability of the tape-wound core can be adjusted to a desired value for a section of the tape-wound core in several ways. For example, the value can be constant or variable depending on the desired applications for the tape-wound core. For example, a periodic distribution of high and low permeability of a tape-wound core can create one permeability material at straights and another at bends. The periodic distribution of high and low permeability can be used for controlling hot spots in the excited core In some examples, uses of variable permeability cores can include decreasing the permeability of ribbon section near tight bends, inside radii of the ribbon, or near pole faces. The permeability of the ribbon can be decreased to avoid flux concentrations. In some examples, the permeability of the ribbon can be decreased to avoid stray fields. In some examples, the permeability of the ribbon can be decreased to avoid imbalanced flux distribution in the soft magnetic core of the nanocomposite material.

The Co-rich nanocomposite can include one or more structures. In some examples, the nanocomposite is produced to a geometry of a planar structure. For example, the nanocomposite can include a stack of planar structures. In some examples, the magnetic anisotropy of each layer or portion of each layer is tunable to a desired value.

Figure 15:
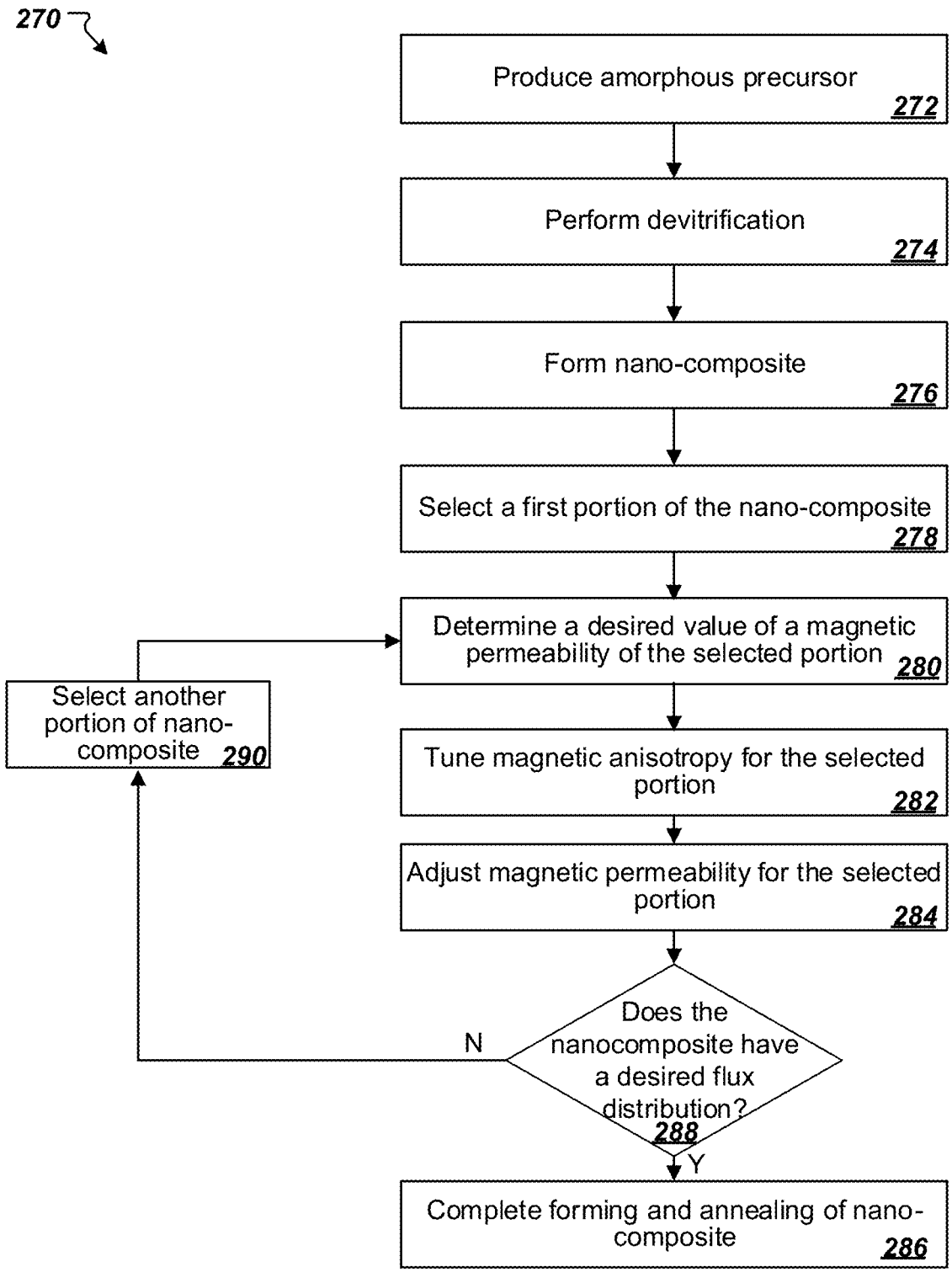

Referring to FIG. 15, a diagram 270 showing an example process of producing a nanocomposite material including a tunable soft magnetic core is shown. An amorphous precursor (272) is produced and devitrification (274) is performed. The nanocomposite is formed (276) using one or more forming processes described above. A first portion of the nanocomposite is selected (278). A desired value of the magnetic permeability is determined (280) based on the flux distribution, geometry of the nanocomposite, flux concentration, and so forth. The magnetic anisotropy is tuned for the selected portion (282) using the methods described above. The magnetic anisotropy is adjusted for the selected portion (284) depending on the required applications of the nanocomposite. If the nanocomposite has the desired flux distribution (288), the forming an annealing of the nanocomposite is completed (286). If further tuning is desired, another portion of the nanocomposite material can be selected for tuning (290).

In some examples the nanocomposite includes cobalt (Co), 30 atomic % or less of Iron (Fe) or Nickel (Ni) and 50 atomic % or less of one or more metals selected from the group comprising boron (B), carbon (C), phosphorous (P), silicon (Si), chromium (Cr), tantalum (Ta), niobium (Nb), vanadium (V), copper (Cu), aluminum (Al), molybdenum (Mo), manganese (Mn), tungsten (W), and zirconium (Zr).

In some examples, the nanocomposite has a composite structure with crystalline grains less than approximately 50 nanometers in average diameter embedded within an amorphous matrix. In some examples, the nanocomposite includes a number of portions that each have a distinct magnetic permeability that are tuned to predetermined levels. In some examples, the nanocomposite is formed through a thermo-mechanical process that includes at least one mechanical operation and at least one thermal operation, and the magnetic permeabilities of each portion of the number of portions are adjusted using the thermo-mechanical process to the predetermined level. For example, the nanocomposite can be a magnetic material that is included as a sensing element in a magnetic field sensor.

Other embodiments are within the scope and spirit of the description claims. Additionally, due to the nature of software, functions described above can be implemented using software, hardware, firmware, hardwiring, or combinations of any of these. Features implementing functions may also be physically located at various positions, including being distributed such that portions of functions are implemented at different physical locations. The use of the term "a" herein and throughout the application is not used in a limiting manner and therefore is not meant to exclude a multiple meaning or a "one or more" meaning for the term "a." Additionally, to the extent priority is claimed to a provisional patent application, it should be understood that the provisional patent application is not limiting but includes examples of how the techniques described herein may be implemented.

It will thus be seen that the objects set forth above, among those made apparent from the preceding description, are efficiently attained and, because certain changes may be made in carrying out the above method and in the construction(s) set forth without departing from the spirit and scope of the disclosure, it is intended that all matter contained in the above description and shown in the accompanying drawings shall be interpreted as illustrative and not in a limiting sense.

A number of exemplary implementations of the invention have been described. Nevertheless, it will be understood by one of ordinary skill in the art that various modifications may be made without departing from the spirit and scope of the invention.

What is claimed is:
1. A method comprising:
 producing an amorphous precursor to a nanocomposite;
 performing devitrification of the amorphous precursor;
 forming, based on the devitrification, the nanocomposite comprising an induced magnetic anisotropy; and
 for a first portion of the nanocomposite,
  determining a desired value of a magnetic permeability of the first portion;
  tuning, based on the desired value, the induced magnetic anisotropy for the first portion; and
  adjusting, based on the tuning of the induced magnetic anisotropy of the first portion, a first magnetic permeability value of the first portion of the nanocomposite, wherein the first magnetic permeability value is different from a second magnetic permeability value for a second portion of the nanocomposite;
  wherein the crystalline grains each comprise a close-packed crystal structure comprising a plurality of aligned faults in the close-packed crystal structure, with each of the faults aligned in a plane of the crystal structure, wherein the plurality of aligned faults in the close-packed crystal structure is configured to cause the induced magnetic anisotropy.

2. The method of claim 1, further comprising:
annealing the first portion of the nanocomposite, the annealing comprising heating the first portion of the nanocomposite to a predetermined temperature;
modifying the first portion of the nanocomposite to a predetermined geometric configuration, the modifying comprising applying a magnitude of stress to the first portion; and
adjusting the predetermined temperature, the predetermined geometric configuration, or the magnitude of stress applied to the first portion based on the desired value of the magnetic permeability.

3. The method of claim 2, further comprising:
based on the annealing, controlling a nano-crystallization process for the nanocomposite in one or more geometries.

4. The method of claim 1, further comprising:
tuning the induced magnetic anisotropy of the first portion by varying one or more of a temperature of one or more heated thermal blocks configured to contact the first portion of the nanocomposite during the tuning and an exposure time of the first portion to the one or more heated thermal blocks.

5. The method of claim 4, wherein the exposure time of the first portion to the one or more heated thermal blocks is varied by adjusting a length of the one or more heated thermal blocks or a speed of the first portion moving between at least two of the one or more heated thermal blocks.

6. The method of claim 1, wherein the nanocomposite comprises a tape wound core, the method further comprising:
based on the tuning, producing one or more of (i) a square loop core, and (ii) a balanced flux distribution in the nanocomposite during a single winding of the tape-wound core.

7. The method of claim 1, further comprising:
tuning the magnetic anisotropy of the first portion by varying one or more of a direction of a stress applied to the first portion and a direction of a magnetic field applied to the first portion.

8. The method of claim 1, further comprising:
adjusting the first magnetic permeability value to be less than the second magnetic permeability value when the first portion comprises one or more of a bend in the nanocomposite, a pole face of the nanocomposite, and a radius of the nanocomposite.

9. The method of claim 1, wherein the adjusting of the first magnetic permeability value reduces a flux concentration in the nanocomposite relative to a flux concentration in the nanocomposite independent of adjusting, reduces a stray field magnitude in the nanocomposite with the adjusted magnetic anisotropy relative to a stray field magnitude in the nanocomposite independent of adjusting, or reduces an imbalance of a flux distribution in the nanocomposite between the first portion and the second portion relative to a flux distribution imbalance in the nanocomposite independent of adjusting.

10. The method of claim 1, further comprising:
forming the nanocomposite to a ribbon geometry with a thickness of 10-35 microns.

11. The method of claim 1, further comprising
forming the first portion and second portions each to a planar geometry.

12. The method of claim 1, wherein the nanocomposite comprises 30 atomic % or less of one of Iron (Fe) or Nickel (Ni) and 50 atomic % or less of metals selected from the group comprising boron (B), carbon (C), phosphorous (P), silicon (Si), chromium (Cr), tantalum (Ta), niobium (Nb), vanadium (V), aluminum (Al), molybdenum (Mo), manganese (Mn), tungsten (W), cobalt (Co) and zirconium (Zr).

13. The method of claim 1, wherein the first magnetic permeability value is adjusted to be less than 50.

14. The method of claim 1, wherein the nanocomposite comprises a composite structure with crystalline grains less than approximately 50 nanometers in average diameter embedded within an amorphous matrix.

15. The method of claim 1, further comprising forming a tape-wound core from the nanocomposite having a diameter size of greater than 6 inches.

16. A method comprising:
producing an amorphous precursor to a nanocomposite;
performing devitrification of the amorphous precursor;
forming, based on the devitrification, the nanocomposite comprising an induced magnetic anisotropy;
for a first portion of the nanocomposite,
determining a desired value of a magnetic permeability of the first portion;
applying a stress to the first portion of the nanocomposite;
tuning, based on the desired value, the induced magnetic anisotropy for the first portion based on a value of the stress applied; and
adjusting, based on the tuning of the induced magnetic anisotropy of the first portion, a first magnetic permeability value of the first portion of the nanocomposite, wherein the first magnetic permeability value is different from a second magnetic permeability value for a second portion of the nanocomposite;
wherein the first magnetic permeability value is adjusted to be less than 90 based on the value of the stress applied being less than 400 Megapascals (MPa).

17. The method of claim 16, wherein the first magnetic permeability value is adjusted to be a value in the range of 80-89.

18. The method of claim 16, wherein the first magnetic permeability value is adjusted to be a value in the range of 70-79.

19. The method of claim 16, wherein the first magnetic permeability value is adjusted to be a value in the range of 60-69.

20. The method of claim 16, wherein the first magnetic permeability value is adjusted to be a value in the range of 50-59.

21. The method of claim 16, wherein the value of the stress applied is less than 100 MPa.

22. The method of claim 16, wherein a response of the nanocomposite is greater than 20 $(J/m^3)$/MPa.

* * * * *